(12) United States Patent
Iyer et al.

(10) Patent No.: US 6,334,205 B1
(45) Date of Patent: Dec. 25, 2001

(54) WAVEFRONT TECHNOLOGY MAPPING

(75) Inventors: Mahesh A. Iyer, Sunnyvale, CA (US); Leon Stok, Mount Kisco; Andrew J. Sullivan, Wappingers Falls, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/255,538

(22) Filed: Feb. 22, 1999

(51) Int. Cl.$^7$ .................................................. G06F 17/50
(52) U.S. Cl. ..................... 716/7; 716/2; 716/6; 716/11; 716/18
(58) Field of Search ................... 716/2, 6, 7, 11, 716/18; 709/220; 717/5

(56) References Cited

U.S. PATENT DOCUMENTS

| | | | |
|---|---|---|---|
| 4,703,435 | 10/1987 | Darringer et al. | 716/18 |
| 4,816,999 | 3/1989 | Berman et al. | 716/2 |
| 4,916,627 | 4/1990 | Hathaway | 716/6 |
| 5,029,102 | 7/1991 | Drumm et al. | 716/18 |
| 5,282,147 | 1/1994 | Goetz et al. | 716/2 |
| 5,519,627 | 5/1996 | Mahmood et al. | 716/18 |
| 5,784,557 | 7/1998 | Oprescu | 709/220 |
| 5,787,010 | 7/1998 | Schaefer et al. | 716/7 |
| 5,790,416 | 8/1998 | Norton et al. | 716/11 |
| 5,854,926 | * 12/1998 | Kingsley et al. | 717/5 |

OTHER PUBLICATIONS

Stok et al., "BooleDozer: Logic Synthesis for ASICs," IBM Journal of Research and Development, vol. 40, No. 4, pp. 407–430, Jul. 1996.

Shepard et al., "Design Methodology for the s/390 Parallel Enterprise Server G4 Microprocessors, " IBM Journal of Research and Development, vol. 41, No. 4/5, pp. 515–547, Jul./Sep. 1997.

Detjen et al., "Technoloby Mapping in MIS," IEEE, pp. 116–119, 1987.

Kurt Keutzer, "DAGON: Technology Binding and Local Optimization, " $24^{th}$ACM/IEEE Design Automation Conference, Paper 21.1, pp. 341–347, 1987.

Lehman et al., "Logic Decomposition During Technology Mapping" .

Grodstein et al., "a Delay Model for Logic Synthesis of Continuously–Sized Networks" .

* cited by examiner

*Primary Examiner*—Matthew Smith
*Assistant Examiner*—Jibreel Speight
(74) *Attorney, Agent, or Firm*—F. Chau & Associates, LLP

(57) ABSTRACT

A technology mapping method and device for mapping cost functions on directed acyclic graphs, using decoupled matching and covering and circumventing the memory explosion usually caused by this decoupling. Multiple matches are generated at the head of a wavefront process and embedded within the network. Covering is done at the tail of the wavefront to optimize one or more cost functions.

11 Claims, 6 Drawing Sheets

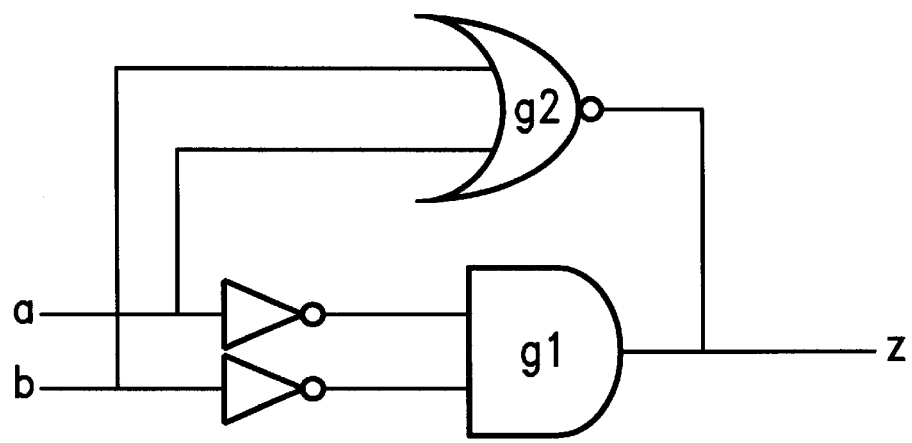
FIG. IA
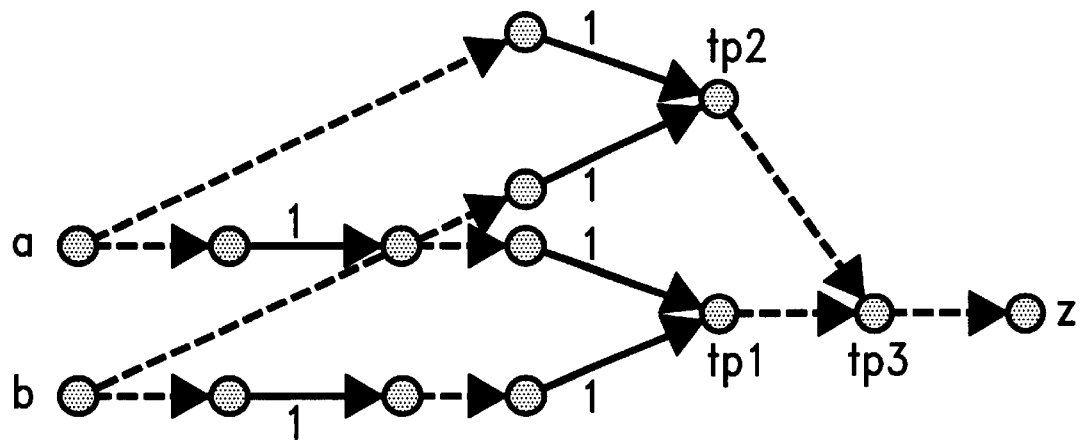
FIG. IB

WAVEFRONT TECHNOLOGY MAPPING

BACKGROUND OF THE INVENTION

1. Technical Field

The present invention relates to a method and a device for optimal technology mapping in logic circuit designs; in particular, a method and device for optimally mapping circuit delay and other cost functions on directed acyclic graphs.

2. Discussion of Related Art

In high-performance logic circuit designs, meeting delay targets in the control logic imposes a major challenge. Control logic usually undergoes changes till very late in the design cycle. Control logic is quite often not regular enough to lead to an intuitive data-flow type implementation. Logic synthesis is therefore necessary to meet the project schedules for these high-performance designs, and ensure a correct implementation of the irregular subcircuits. Logic synthesis is the process of automatically generating optimized logic-level representation from a high-level description. With the rapid advances in integrated circuit technology and the resultant growth in design complexity, designers increasingly rely on logic synthesis to shorten the design time while achieving performance objectives.

Known logic synthesis systems typically employ a three-phase methodology. The phases are usually: (1) technology independent optimization; (2) technology mapping; and (3) timing corrections. See, L. Stok et al. Booledozer logic synthesis for asics. *IBM Journal of Research and Development*, Vol. 40(4): 407–430, July 1996. Varying the three phases impact greatly the structure and cost functions of technology mapped logic. Cost functions affect the area of the cells, delay through the cells or other measures of merit. See "Technology mapping in MIS", E. Detjens, G. Gannot, R. Rudell, A. Sangiovanni-Vincentelli, and A. Wang, November 1987. Minimizing delay in the technology mapping phase had been an important goal in the aforementioned designs.

Traditional technology mapping can be described as a 3-step procedure. First, the technology-independent circuit is decomposed in terms of some primitives to have some well-defined logic structure to aid the technology mapping process. This phase is typically referred to as the circuit decomposition phase. Second, a pattern matcher performs analysis on the circuit and the library, either structurally or functionally, and determines a set of matches for all nodes in the circuit. The third and final step identifies the best set of matches (based on some cost functions) for the circuit such that every node in the circuit is covered exactly once. The final set of matches that cover all the nodes in the circuit are used to describe the circuit in terms of the target technology library cells.

Another target of optimization in circuit synthesis is the reduction of the area of the cells. In K. Keutzer. Dagon: "Technology binding and local optimization by dag matching", In *Proc of the 24th Design Automation Conference*, June 1987, a technology independent net list description of a combinational circuit is partitioned into a forest of trees, then using a tree pattern matching automation, individual trees are matched to create a technology bound circuit. The least cost in size or area is obtained. Drawback of this technique is that it is only optimal for trees. Most circuits consist of directed acyclic graphs (DAGs) and require a non-trivial decomposition of the DAGs into trees.

Technology mapping works mostly on a fixed subject graph. Therefore, the result is highly dependent on the preceding decomposition of the network. In E. Lehman, Y. Watanabe, J. Grodstein, and H. Harkness, "Logic decomposition during technology mapping", *IEEE Trans on CAD*, 16(8):813–834, August, 1997, logic decomposition is combined with the mapping phase itself to avoid problems of optimizations in disconnected phases. The proposed algorithm runs on tree leaf DAGs. However, exhaustive embedding of decompositions leads to a large increase in the subject graph, which renders the algorithm impractical for larger sizes of circuits.

A need therefore exists for a simple and practical device and method for logic circuit design that is delay optimized for DAGs.

SUMMARY OF THE INVENTION

According to one aspect of the present invention, a method for optimizing a cost function in logic synthesis for directed acyclic graphs is provided, comprising the steps of: partitioning a circuit into a plurality of slices, each slice representing a subcircuit, each subcircuit having a netlist, a head boundary closer to primary outputs, and a tail boundary closer to primary inputs of the circuit; matching each net in each subcircuit by advancing from the head boundary of the first subcircuit through each partitioned subcircuit in the direction of primary outputs while generating and implementing cell matches; covering each net in each subcircuit by advancing from the tail boundary of the first subcircuit through each partitioned subcircuit in the direction of primary outputs while performing timing analysis and selecting matches having optimal times; and discarding portions of subcircuits not selected.

According to another aspect of the present invention, a stored program device readable by a computer, tangibly embodying a program of instructions executable by the computer to perform method steps for optimizing a cost function in logic synthesis is provided, the method steps comprising: partitioning a circuit into a plurality of slices, each slice representing a subcircuit, each subcircuit having a netlist, a head boundary closer to primary outputs, and a tail boundary closer to primary inputs of the circuit; matching each net in each subcircuit by advancing from the head boundary of the first subcircuit through each partitioned subcircuit in the direction of primary outputs while generating and implementing cell matches; covering each net in each subcircuit by advancing from the tail boundary of the first subcircuit through each partitioned subcircuit in the direction of primary outputs while performing timing analysis and selecting matches having optimal times; and discarding portions of subcircuits not selected.

Preferably, the method for optimizing a cost function in logic synthesis includes use of fall and rise time delay models in performing timing analysis for each net in each subcircuit. The step of selecting matches preferably includes selection from a load-independent delay library.

Further, the step of generating and implementing cell matches may include one of or a combination of a structural matcher, a boolean matcher and a PLA matcher.

BRIEF DESCRIPTION OF THE DRAWINGS

FIGS. 1A and 1B illustrate a circuit DAG and a timing graph of the circuit;

DETAILED DESCRIPTION OF PREFERRED EMBODIMENTS

Figure 2A:
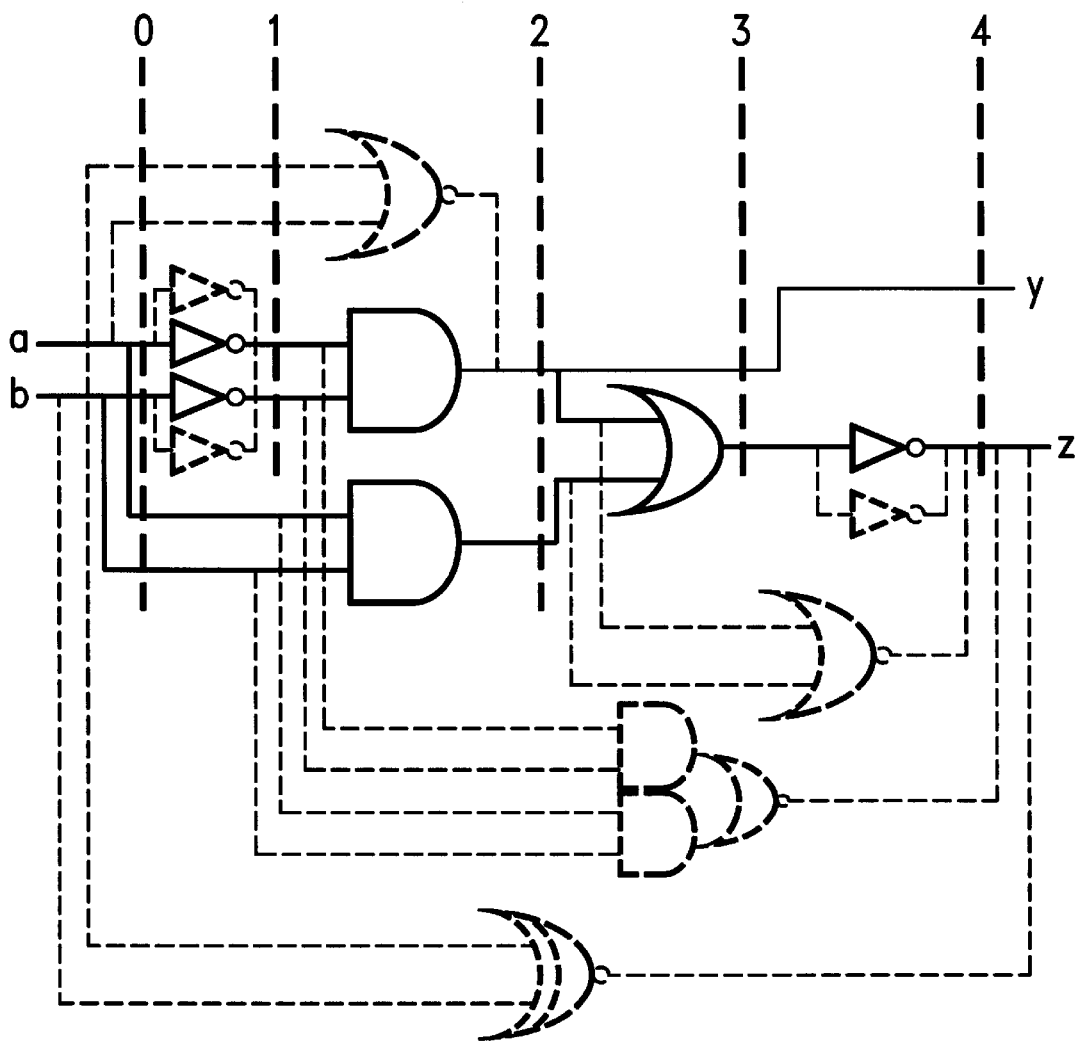
FIG. 2A illustrates a circuit for optimization and the partitioning of the circuit in accordance with an embodiment of the present invention.

A method and device of the present invention provides technology mapping for optimizing figures of merit including delay and area on DAGs. The present invention combines the delay optimal mapping for general DAGs with a load-independent arrival time optimal pre-decomposition and an on-the-fly decomposition. Optimality with respect to arrival times is on each path in the network. Other (non-delay) figures of merit can be minimized in a second pass.

According to an illustrative embodiment of the present invention, static timing analysis is performed on the DAG of the network. The vertices, or nodes, of the graph are the points at which events can occur (e.g., signals can arrive) and are referred to as timing points. The timing points include boundary pins and pins on logic gates in the network.

Each timing point in the network has an associated arrival time $t_a(p)$ and an associated required time $t_r(p)$. Arrival times at the primary inputs are given. Timing analysis propagates these arrival times forward through the network and calculate arrival times at all other timing points. In late mode timing analysis, at each timing point the latest arriving value is being propagated. Similarly, required times are derived from the required times at the primary outputs. They are propagated backwards through the network. The slack $s(p)$ of each timing point is defined by $s(p)=t_r(p)-t_a(p)$. The worst slack $s_w(p)$ is defined as the most negative slack on any timing point in the network. Note that a critical path can be defined as a path from primary input to primary output on which all timing points will have the same worst slack $s_w(p)$.

Static timing analysis on DAGs is generally described in numerous references. See, for example, U.S. Pat. Nos. 5,282,147 and 4,916,627 to Hathaway et al., and R. H. Sr. "Timing verification and the timing analysis program", In *ACM IEEE Nineteenth Design Automation Conference*, pages 594–604, Las Vegas, June 1982. The disclosures of the patents and article references are incorporated by reference herein.

The static timing analysis performed in accordance with a preferred embodiment of the present invention deviates from standard timing analysis in at least two ways. Traditionally, delay rules for standard cells have been based on the actual size of the gate. If it is assumed that delay rules are continuously parameterizable, quantities directly related to delay such as normalized gain and beta can be used. Normalized gain NG can be expressed as $NG=C_1/C_{in}$ where $C_1$ is the capacitive load and $C_{in}$ is the input capacitance of the gate. Beta is the ratio of the rise to fall times. See, for example, J. Grodstein, E. Lehman, H. Harkness, B. Grundmann, and Y. Watanabe, "A delay model for logic synthesis of continuously sized networks", In *Proc of the Int. Conf. On Computer Aided Design*, pages 458–462, November 1995. The gain is not directly dependent on the size of the gate, which increases linearly with $C_{in}$ or the load, but merely depends on the ratio of both. This leads to the following set of delay d equations:

d=f(input_slew,gain,beta) and output_slew=f(input_slew,gain,beta).

See, K. Shepard and et al., "Design methodology for the s/390 parallel enterprise server g4 microprocessors", *IBM J. Res. Develop.*, 41(4/5): 515–547, July/September 1997. In these delay equations, the delay is independent of the load of the cells. Input slew will be propagated by the timer. Thus, if values for gain and beta are known the delay of each cell is determined. During the technology mapping according to a preferred embodiment of the present invention, matches are created for 'ideal' gain and beta values. Accordingly, a preferred delay model of the present invention is load independent.

Second, a new late mode timing propagation mode is defined for multi-source nets. A multi-source net is a net with multiple driver cells. At regular timing points with multiple incoming arcs the latest arrival time is propagated. In the timing points related to the multi-source nets the earliest arrival time will be propagated.

In FIGS. 1A and 1B an example is shown to illustrate the timing analysis. The dashed edges correspond to the net delay arcs, the solid edges to the gate delay arcs. All net delays are assumed zero and gate delays one. The timing point tp1 at the output of gate gl is a regular point and the latest arrival (delay of 2) is propagated. However, at the multi-source timing point tp3, the value coming from tp2 (delay of one) is propagated as the earliest, late-mode arrival time.

During the processing according to the illustrative embodiment of the invention, matches are implemented directly in the netlist. This will result in a large increase of fanouts at the inputs of the patterns and will result in multi-source nets at the outputs of the patterns. Since the illustrative delay model is load-independent the increase in fanout will not invalidate the timing results. As will be discussed in the following section, a multi-source timing propagation processing according to the present invention enables trade-off of the various matches.

It is to be appreciated that the processing method of the illustrative embodiment of the present invention is preferably implemented by stored software in connection with a stored cell or netlist database in a general purpose or special purpose computer. The illustrative processing is also preferably implementable by means of a device having stored instructions or commands readable or executable by a computer to cause the computer to perform the functions described in the disclosure herein.

A method of the illustrative embodiment according to the invention performs technology mapping which includes combining the matching and covering phases. In this embodiment, circuit delay under the load-independent delay model is the primary cost function to be optimized. Essentially, the matching and covering phases work on different non-overlapping subcircuits. The non-overlapping subcircuits are defined using a wavefront process. The wavefront mapping process follows standard technology independent optimization and delay-driven decomposition. The wavefront process decouples the match generation and covering problems. Advantageously, the method of the illustrative embodiment of the present invention uses the underlying net list for the circuit as a starting point and performs structural transformations on this net list for either implementing several matches on a net (during match generation) or for deleting useless matches (during covering). Using the underlying net list itself for match representation allows tight integration of the process with static timing and area analysis tools to provide accurate information on the portion of the circuit that has been mapped and reliable information to trade off alternatives for the portion of the circuit being mapped.

Preferably, the wavefront process partitions the circuit represented as DAG into vertical slices or subgraphs. The subcircuit isolated by the wavefront is bounded by the head and the tail of the wavefront. The head of the wavefront is the boundary closer to the primary outputs (Pos) and the tail of the wavefront is the boundary closer to the primary inputs (Pis) of the circuit. (Referring briefly to FIG. 2A, the vertical line with label '1' is the head and the line label '0' is the tail.) In addition to decoupling the match generation and covering problems, the wavefront also allows the match generation to work only on a subcircuit, thereby preventing an explosion in the number of matches stored at any time. Also, matches are allowed to be generated and maintained dynamically, as opposed to generating all the matches for the entire circuit a-priori.

The width of the wavefront is determined a-priori. It is this width that determines the optimality of the process.

It can be shown that in a degenerate case when the width of the wavefront equals the width of the entire circuit (for a given decomposition), the covering phase of the wavefront algorithm will result in a delay-optimal solution under the load-independent delay model. However, in practice, the width of the wavefront will be much smaller than the width of the entire circuit. The wavefront process produces a cover of matches such that: (1) all nodes in the circuit are covered by exactly one match; and (2) the technology mapped circuit is near-optimal in circuit delay under the load-independent delay model.

A portion of the stored program for implementing the wavefront functions is listed herein:

```
Procedure wavefront_map(design, wave_width, max_levels) {
    /* wave_width = width of the wavefront. */
    Levelize the design.
    max_levels = maximum number of levels in the design.
    head_level = 1.
    while (head_level ≦ max_levels) {
        head_nets = list of all nets on head_level.
        tail_level = head_level - wave_width.
        if (tail_level ≦ 0) {
            tail_level = 0.
        }
        /* Generate matches on the head of the wavefront */
        foreach net, n in head_nets {
            generate_and_implement_matches (design, n,
            tail_level).
        }
/*Perform covering on the tail of the wavefront */
        if (tail_level) ≧ 0) {
            cover_nets(design, tail_level).
        }
        increment head_level.
    }
        /* Move the tail, if it has not yet moved*/
        if (tail_level) ≦ 0) {
            tail_level = 1.
        }
    }
/* Perform covering on the remaining uncovered levels */
while tail_level ≦ max_levels)
        cover_nets (design, tail_level).
        increment tail_level.
    }
}
Procedure cover_nets (design, tail_level) {
    foreach net, m, in tail_level{
        Perform static timing analysis and compute the
        driver pin that has the fastest arrival time.
        fastest_pin = driver pin that has the fastest
        arrival time.
        fastest_cell = driver cell for fastest_pin.
        Disconnect all driver cells on m, except
        fastest_cell, and perform a cleanup operation on
        their exclusive input cones of logic. The
        technology-independent cell and its exclusive
        input cone of logic are also implicitly cleaned
        up.
    }
}
```

Figure 4A:
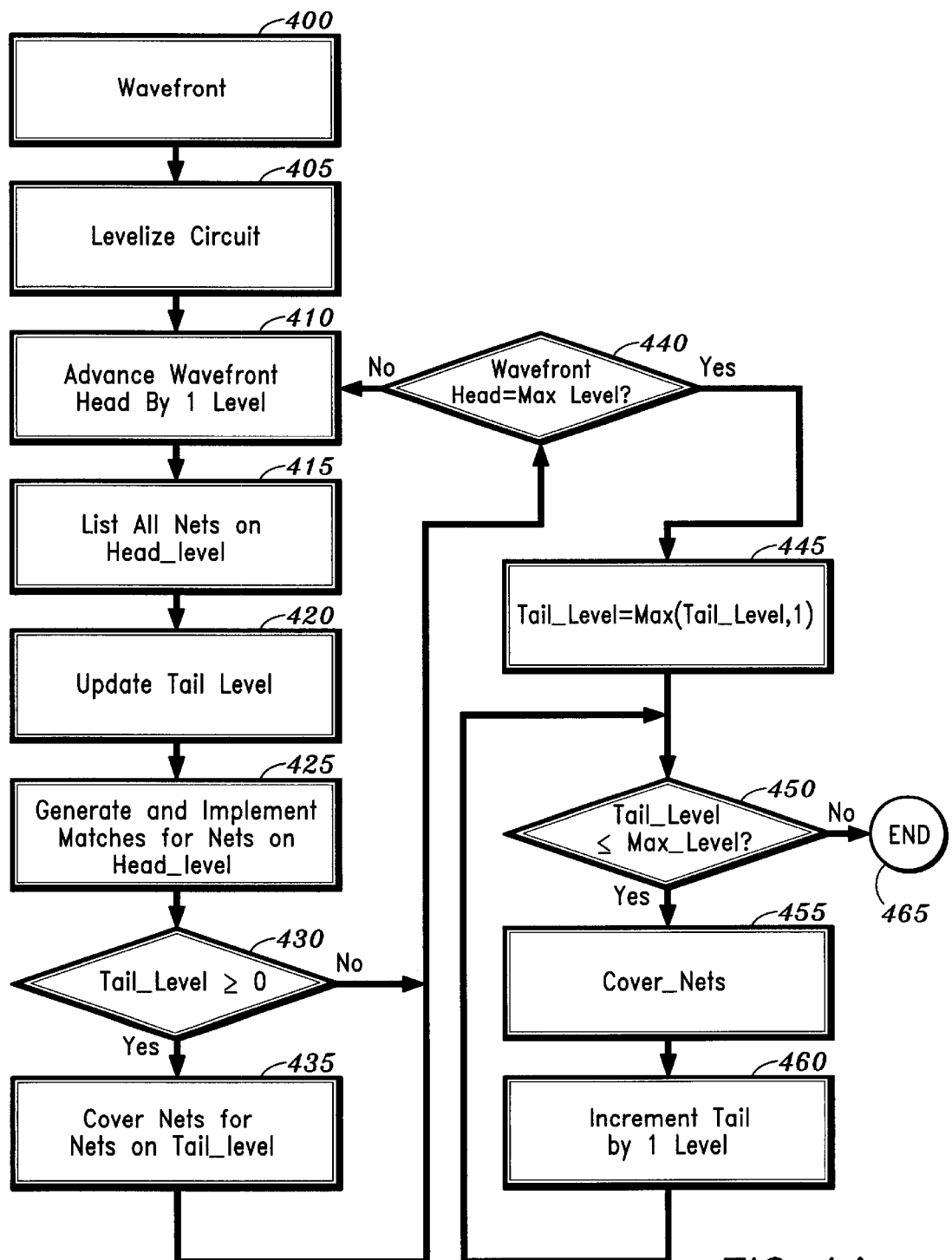
FIGS. 4A and 4B illustrate an exemplary flow diagram of a wavefront process according to the present invention.

FIG. 4A is an illustrative flow of a wavefront process according to the present invention. Referring to FIG. 4A, the wavefront assumes that the circuit is levelized from input to output (step 405). All nets in a level are assigned a level number and it is assumed that for every level, a list of nets for that level is available. We also assume that given a net, its level number can also be obtained. The head and tail of the wavefront define a window, such that for a particular step, match generation happens at the head and covering happens at the tail.

According to a preferred embodiment of the process of the present invention, both the head and the tail of the wavefront start at level 0. (The Pis of the circuit are considered as level '0' nets.) The head of the wavefront advances one step to level '1' (step 410). Net listing, updating and match generation and implementation is done for all nets on this level (steps 415 to 425). The tail level is updated by checking if the head level has advanced beyond the width of the wavefront. If not, the tail is kept at the zero level. Matches are preferably generated using a combination of pattern matchers. Known pattern matchers can be employed, such as: a structural matcher performing pure structural isomorphism tests; a boolean matcher using BDDs; and a Programmable Logic Array(PLA) matcher using the truth-tables of gates in the circuit. Exemplary pattern matchers will be further described below. All pattern matchers have one thing in common; given a node in the circuit, they generate a set of technology cell matches for that node. As matches are generated for a node, they are implemented in the underlying net list as drivers of a multi-source net. A multi-source net is a net with multiple driver cells. The multiple drivers on a net include the technology-independent cell and all the technology cell matches found for that node. The match implementation process also connects the input pins of the technology cells to the appropriate nets in the circuit. Unlike conventional technology mapping, matches are not limited to fanout-free regions; i.e. the match generation search process performs its search across fanout. However, the subcircuit for the match generation search process is isolated by the wavefront; i.e. the match generation search process starts at a node on the head of the wavefront and stops as soon as it encounters a net on the tail of the wavefront or a net on a level below the tail of the wavefront.

Implementing certain pattern matches also requires logic duplication. A key advantage of implementing matches in the net list as multi-source nets is that logic duplication is achieved implicitly. The head of the wavefront keeps advancing one step at a time until matches have been generated for all nets on the highest level of the circuit.

Figure 4B:
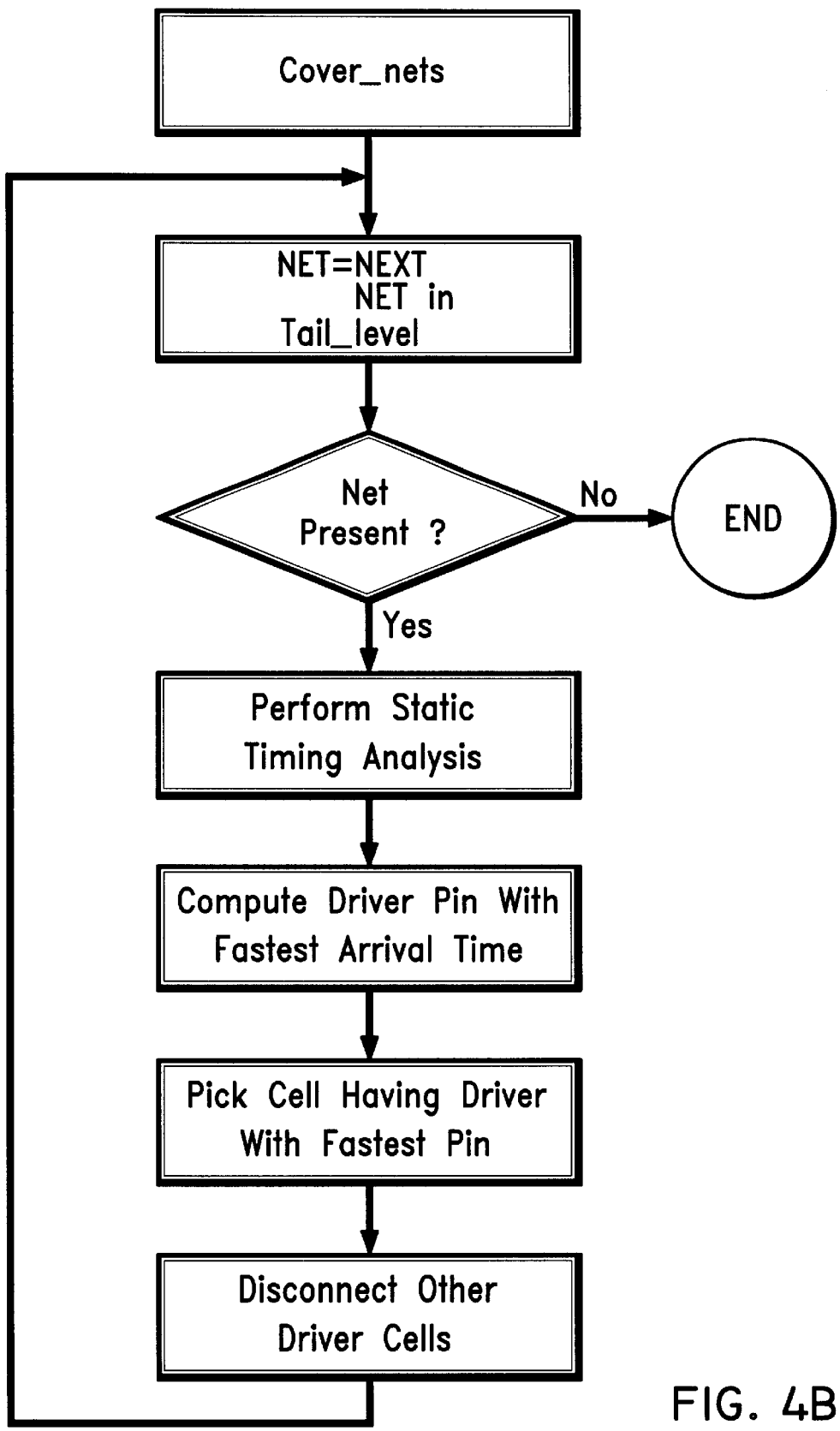

The tail does not start moving until the head has moved for a number of steps equal to the width of the wavefront. Once this has happened, the tail of the wavefront starts moving (steps 430 to 440). Covering for selecting the best match occurs for all nets on the tail of the wavefront (step 455). FIG. 4B illustrates a representative flow of a covering process. The covering implicitly performs static timing analysis to determine the match with the best arrival time.

Implementing the matches in the net list (as multi-source net drivers) allows the method to evaluate all the matches in the context of the design in which they are instantiated. Under the load-independent delay model, the arrival time computed for a matched cell output must also be accurate because the input nodes of the cell have already been mapped and the cell's delay does not depend on the load driven by the cell. Only this match is retained as a driver to the net and all other matches on the net are deemed sub-optimal. The sub-optimal match cells and their exclusive input cones are removed or destroyed from the net list. The original technology-independent driver cell on the net is also disconnected. The tail of the wavefront keeps advancing one step at a time until all nets on the highest level of the circuit have been covered.

It is to be appreciated that the wavefront process assumes that the initial circuit does not have multi-source nets (like tri state busses)or multiple-output matches.

Listed below is a portion of the wavefront program for implementing a matching process.

```
Procedure generate_and_implement_matches (design,net,
tail_level) {
    /* Match generation */
    match_list = get_all_pattern_matches(design,net,
tail_level).
    /* Match implementation as multiple-source net drivers
    */
    implement_matches(design, match_list, net).
}
Procedure get_all_pattern_matches(design,net,tail_level) {
    Using the structural, boolean and/or PLA matchers,
    generate all the pattern matches in the design for net,
    such that the search for pattern matches starts at net
    and ends whenever a net whose level ≦ tail_level is
    encountered.
    For each match, store the technology library cell and
    the corresponding nets in design that need to be
    connected to the inputs of the technology cell. Let
    this data structure be match_struct.
    match_list = list of match_structs for all matches
    found.
    return match_list.
}
Procedure implement_matches(design,match_list, net) {
    foreach match_struct in match_list{
        technology_cell = match cell from match_struct.
        input_list = list of input nets from match_struct.
        Make technology_cell a driver of net in design.
        Connect all inputs of technology_cell to the
            corresponding nets of design in input_list.
    }
}
```

Figure 2B:
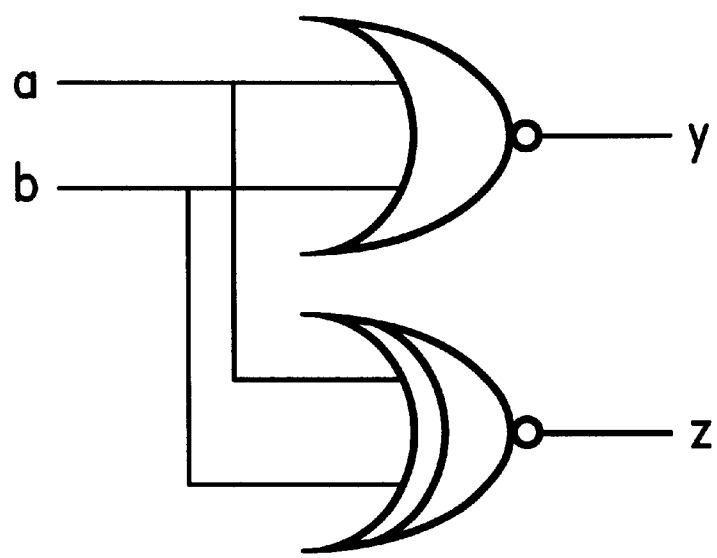
FIG. 2B shows a mapped circuit of FIG. 2A with a width at 4.
Figure 2C:
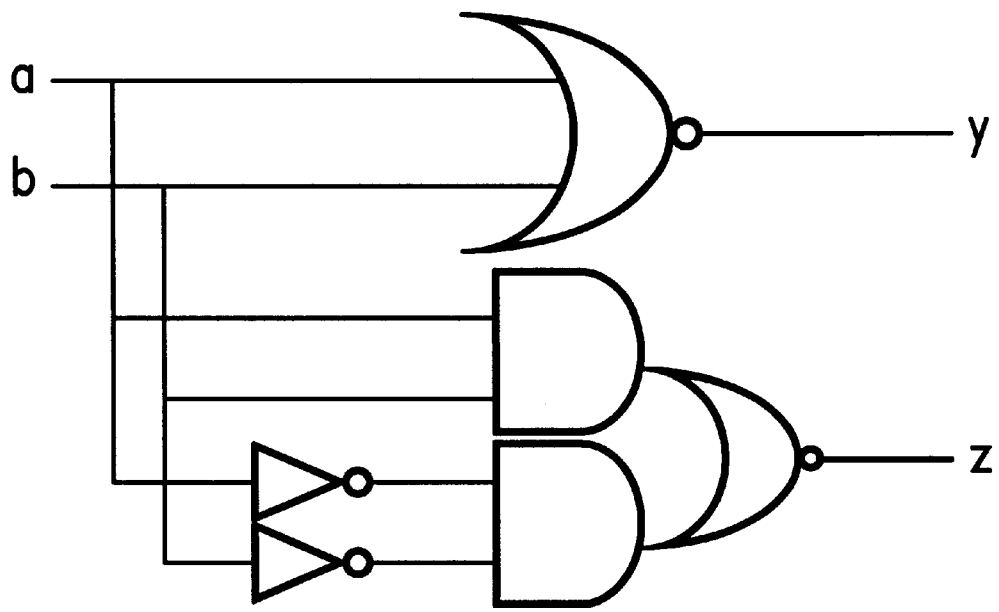
FIG. 2C shows a mapped circuit of FIG. 2A at width equals 3.

Referring to FIGS. 2A, 2B and C, wherein an illustrative wavefront process is applied to an exemplary circuit. For purposes of this illustration, it is assumed that the technology library contains only INV., NOR, AXOS and XNOR gates. All technology cells and their embedding in the network are shown in dashed lines. Head and tail are shown by dashed vertical lines. The circuit is patterned into 4 levels or a width of '4', when the head of the wavefront reaches level 1 from level 0, the inverters are added. At level 2 the NOR gate is added. At level 3, no matches are found in the inverting-only library. At level 4, the inverter, NOR, AOI and XOR are inserted. The head of the wavefront has completed the entire width and the tail starts to move. At level 1, the inverters are selected. At level 2 the NOR is selected, implementing the function for output y. (y is disconnected from the output of the AND). Finally, at level 4 the exclusive NOR is selected. The unselected gates are disconnected from the network. The final mapped circuit is shown in FIG. 2B. The implicit cloning is seen in the selection of the XNOR for output z and NOR for output y. As an illustration, if width=3, the XOR match would not be found and the result would be as shown in FIG. 2C. It can be seen that the circuit implementation with the wavefront traversing the entire width (FIG. 2B) is optimized as compared to the wavefront not completing the entire width (FIG. 2C).

It is shown herein that the wavefront process produces optimal-delay mapping for DAGs under the load-independent delay model:

Assume that w is the width of the wavefront and D is the depth of the circuit. Also assume that for every node, all pattern matches can be found in the subcircuit that the pattern matchers work on.

If w=D, then the mapped net list obtained using the wavefront algorithm is optimal in delay, under the load-independent delay model.

Since w=D, the pattern matchers can search for matches for a node in the entire fain cone of the node. Thus, all pattern matches can be found for all nodes in the circuit. Under the load-independent delay model, the arrival time on the output of a cell depends only on the arrival times of its inputs and the intrinsic delay of the cell. The covering step of the wavefront process proceeds in a levelized fashion from inputs to outputs. Hence, when covering a node, the entire fain cone of the node is guaranteed to be mapped. When covering a node on level 1, the match that produces the fastest arrival time will be selected as the best match for that node. For nodes on higher levels, by induction, it follows that the arrival times on the inputs of all matches on a node are guaranteed to be the fastest arrival times of those inputs. Since the delay is known for every technology cell, the technology cell producing the best arrival time at a node will be selected as the best match for that node.

Again, by induction, all technology cells on all paths to a primary output PO will be such that the fastest arrival time is produced on that PO. Under the load-independent delay model, this ensures that the mapped circuit is optimal in delay.

In the general case, a width smaller than the depth of the circuit can be used. Practically, it needs to be set to the depth of the largest match that the matchers can find. This is a function of the cells available in the library, the power of the matchers and the decomposition of the design. As shown in Table 1, the width can usually be kept to a relative small number resulting in significant memory savings to store the patterns, and significant saving in the size of the network to be timed.

The above-mentioned pattern matchers employ a common mechanism to prune candidate matches quickly using signatures suitable for a given representation. (A signature is a numerical representation that differentiates matches based on functionality.) The candidates that result in a positive hash are then compared using the actual comparison representation. (See, J. Monde, P. Monitor, and S. Mali, "Limits of using signatures for permutation independent boolean comparison", In *Proceedings of the ASP DEC'95. Asia and South Pacific Design Automation Conference*, pages 459–463, 1995.

Figure 3:
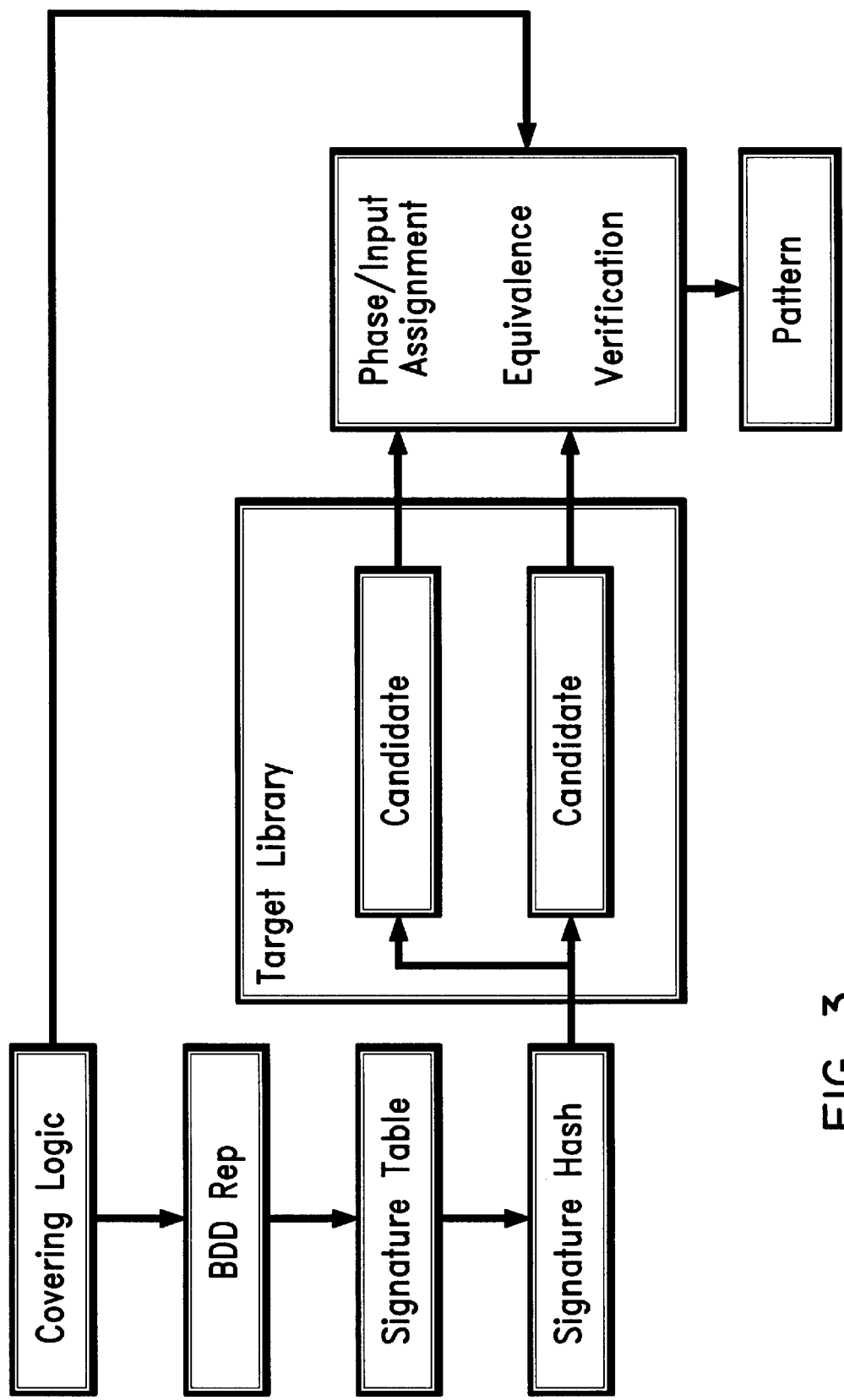
FIG. 3 illustrates an exemplary flow of a match generation process according to an embodiment of the present invention.

As an example the boolean matcher as shown in FIG. 3 is described. Boolean matching attempts to determine the equivalence of two boolean functions under arbitrary input and output phase assignments and input permutations. In the worst case, the determination of equivalence for an N-input one-output function, would require $2^{N+1}*N!$ separate verifications. One technique to make such a problem more tractable is the use of signature tables to represent each function. For any type of signature table a simple hash function can be utilized to quickly identify cells in a technology library that are potential candidates for covering a portion of logic. In addition, such signature tables can be used to quickly identify possible phase assignment and input permutation. Since some aliasing may occur among inputs in the signature table, final equivalence is always checked by building a BDDs representation of the covered logic and comparing against the technology cell BDDs representation for equivalence (isomorphism).

The illustrative embodiment of the invention employing the wavefront process is suitable for optimizing a plurality of cost functions other than circuit delay.

In most timing models stored in libraries, different values are maintained for the rising and falling delays. Applying the wavefront process, instead of a single match, the fastest match for both the falling and rising delay are maintained. The two patterns remain connected to the net. The timing propagation of the earliest late mode falling and rising times could be propagated through different paths in the DAG. In a second pass over the circuit from output to inputs, the driving cell that minimizes the rising and falling delay, the worst of the two, or a combination of both is selected.

In some designs, the designer may not be interested in minimizing the delay through the circuit but instead is interested in meeting the specified slack. (A 'slack' can be defined as the difference in delay between required arrival time and actual arrival time.) Since the wavefront process optimizes arrival times, it therefore maximizes slack at all points in the network. In this case, the arrival of the signal can be delayed or slowed down to within (or even less than) the amount of specified slack in non-critical regions of the circuit. This freedom can be used to optimize another cost function like area. As shown for the rise/fall time optimization, in a second pass, other cost functions can be optimized without sacrificing the worst case slack. Critical regions can only be reliably determined if the entire circuit has technology cells. The required time prediction in the unmapped circuit to the right of the head of the wavefront is too unreliable and a two pass approach is chosen here as well. Instead of keeping only the fastest match, one or more other matches are kept as well. For example, the smallest match. In a second pass, from outputs to inputs, the slower patterns can be chosen in the off-critical regions to minimize or optimize other cost functions such as size or area.

A dynamic decomposition and decomposition on the fly process according to the present invention is now described.

The model as described above allows for multiple sources on each net. The additional multi-sources can either be technology matches or alternate decompositions of the subject graph. A decomposition technique similar to one described in E. Lehman, Y. Watanabe, J. Grodstein, and H. Harkness, "Logic decomposition during technology mapping", *IEEE Trans on CAD*, 16(8):813–834, August 1997, can be employed in connection with the illustrative embodiment of the present invention. The disclosure of Lehman et al. is incorporated by reference herein.

It is possible to delay some amount of decomposition by preserving large input primitives until such gates are encountered by the head of the wavefront. At this point the arrival times at the inputs to these gates are now defined by the combination of covered logic and the defined propagation model. These arrival times will reflect the optimal delay values up to this level of logic. Given these arrival times any large primitives at the head of the wavefront are first decomposed into a network of 2-input NAND gates such that the number of logic levels between late arriving signals and the output net of the original primitive is minimized. A simple yet powerful decomposition scheme is the repeated extraction of 2-Input NAND gates corresponding to the pairs of input signals with fastest arrival times. This continues until the original primitive has been completely decomposed into a tree of 2-Input NAND gates. A series of sub-levitation lists can be maintained in order to add newly created nets to the wavefront levitation tables. After the levitation tables are updated, the match generation and tail-based covering proceed in their typical fashion.

Test Results

TABLE 1

Impact of wavefront width

| Des | width | patterns | worst negative slack | Runtimes |
|---|---|---|---|---|
| C1355 | 1 | 548 | 6.08 | 13.44 |
| C1355 | 2 | 598 | 5.78 | 14.26 |
| C1355 | 4 | 725 | 5.59 | 14.97 |
| C1355 | 10 | 821 | 5.52 | 17 |
| C1355 | 15 | 853 | 5.52 | 19.53 |
| C1908 | 1 | 541 | 9.04 | 13.41 |
| C1908 | 2 | 636 | 8.55 | 15.72 |
| C1908 | 4 | 760 | 8.17 | 16.91 |
| C1908 | 10 | 793 | 8.17 | 18.17 |
| C1908 | 15 | 800 | 8.17 | 17.2 |
| C2670 | 1 | 735 | 7.10 | 16.62 |
| C2670 | 2 | 952 | 6.66 | 21.98 |
| C2670 | 4 | 1085 | 6.47 | 22.37 |
| C2670 | 10 | 1155 | 6.47 | 26.63 |
| C2670 | 15 | 1164 | 6.42 | 26.13 |
| C3540 | 1 | 1192 | 10.69 | 29.63 |
| C3540 | 2 | 1586 | 10.29 | 37.98 |
| C3540 | 4 | 2032 | 9.95 | 47.88 |
| C3540 | 10 | 2149 | 9.91 | 52.75 |
| C3540 | 15 | 2164 | 9.91 | 54.14 |
| C432 | 1 | 172 | 7.57 | 4.88 |
| C432 | 2 | 217 | 6.20 | 5.74 |
| C432 | 4 | 247 | 6.09 | 6.11 |
| C432 | 10 | 289 | 6.09 | 6.26 |
| C432 | 15 | 299 | 6.09 | 7.14 |
| C499 | 1 | 566 | 6.91 | 6.22 |
| C499 | 2 | 629 | 6.61 | 15.36 |
| C499 | 4 | 750 | 6.30 | 15.76 |
| C499 | 10 | 794 | 6.28 | 17.19 |
| C499 | 15 | 853 | 6.22 | 20.33 |
| C5315 | 1 | 1807 | 9.45 | 54.23 |
| C5315 | 2 | 2109 | 9.13 | 48.31 |
| C5315 | 4 | 2562 | 8.48 | 53.73 |
| C5315 | 10 | 2744 | 8.48 | 61.74 |
| C5315 | 15 | 2792 | 8.48 | 58.46 |
| C6288 | 1 | 3227 | 31.23 | 142.61 |
| C6288 | 2 | 3985 | 30.00 | 156 |
| C6288 | 4 | 4256 | 29.14 | 133.1 |
| C6288 | 10 | 4355 | 29.09 | 139.27 |
| C6288 | 15 | 4398 | 29.09 | 139.33 |
| C7552 | 1 | 2310 | 14.72 | 83.6 |
| C7552 | 2 | 2676 | 14.48 | 79.72 |
| C7552 | 4 | 3260 | 14.19 | 94.56 |
| C7552 | 10 | 3457 | 14.19 | 85.59 |
| C7552 | 15 | 3502 | 14.14 | 93.73 |
| C880 | 1 | 429 | 7.37 | 10.59 |
| C880 | 2 | 522 | 7.01 | 10.43 |
| C880 | 4 | 603 | 6.80 | 11.49 |
| C880 | 10 | 640 | 6.73 | 12.35 |
| C880 | 15 | 666 | 6.73 | 13.88 |

TABLE 2

WaveFront mapper and Industrial mapper

| Circuit | delay | Wfdelay | area | WFarea |
|---|---|---|---|---|
| C432 | 8.62 | 6.09 | 184 | 247 |
| C499 | 7.81 | 6.30 | 665 | 750 |
| C880 | 8.30 | 6.80 | 460 | 603 |
| C1355 | 6.61 | 5.59 | 648 | 725 |
| C1908 | 9.22 | 8.17 | 614 | 760 |
| C2670 | 6.83 | 6.47 | 669 | 1085 |
| C3540 | 10.45 | 9.95 | 1268 | 2032 |
| C5315 | 8.51 | 8.48 | 1754 | 2562 |
| C6288 | 44.2 | 29.14 | 4104 | 4256 |
| C7552 | 19.67 | 14.19 | 2751 | 3260 |

In table 1, the effect of varying wavefront sizes from 1 to 15 are shown for ten circuits. More patterns are found at larger wavefront sizes. However, the effect on the delay of size more than 4 is readily negligible in this library. Run times grow linearly with the number of patterns.

In Table 2, the illustrative wavefront mapping process according to the present invention is compared against a state-of-the-art industrial technology mapping tool. The technology mapping parts are compared, i.e. The same net list is given to both programs before technology mapping and results are measured directly after a fully mapped network is obtained. Table 2 shows that the wavefront process consistently produces superior delay results. Sometimes there is a large improvement in delay for little area (C6288), sometimes there is little improvement in delay for larger area (C5315). On the average the wavefront algorithm produces about 22% faster circuits with about 24% area overhead.

While the invention has been described in its preferred embodiments, it is to be understood that the words which have been used are words of description rather than limitation and that changes may be made without departing from the scope and spirit of the invention in its broadest aspects. The scope of the invention is defined by the following claims.

What is claimed is:

1. A method for optimizing a cost function in technology mapping in logic synthesis for directed acyclic graphs, comprising the steps of:

partitioning a circuit into a plurality of slices, each slice representing a subcircuit, each subcircuit having a netlist, a head boundary closer to primary outputs, and a tail boundary closer to primary inputs of the circuit;

matching each net in each subcircuit by advancing from the head boundary of the first subcircuit through each partitioned subcircuit in the direction of primary outputs while generating and implementing cell matches;

covering each net in each subcircuit by advancing from the tail boundary of the first subcircuit through each partitioned subcircuit in the direction of primary outputs while performing timing analysis and selecting matches having optimal times; and discarding portions of subcircuits not selected.

2. The method for optimizing a cost function in logic synthesis according to claim 1, wherein said step of selecting matches includes selection from a load-independent cell library.

3. The method for optimizing a cost function in logic synthesis according to claim 1, wherein said step of performing timing analysis includes use of fall and rise time delay models for each net in each subcircuit.

4. The method for optimizing a cost function in logic synthesis according to claim 1, which said step of selecting matches having the optimal times includes selecting times to optimize a specified time slack of said circuit.

5. The method for optimizing a cost function in logic synthesis according to claim 1, wherein said cost function to be optimized include circuit delay and the optimal times to be selected is the fastest arrival time.

6. The method for optimizing a cost function in logic synthesis according to claim 1, further including performing a second pass in advancing from head to tail boundaries to optimize said cost function.

7. The method for optimizing a cost function in logic synthesis according to claim 1, wherein said step of generating and implementing cell matches includes use of one of or a combination of a structural matcher, a boolean matcher and a PLA matcher.

8. The method for optimizing a cost function in logic synthesis according to claim 1, wherein said matching step is based on an inverting-only cell library.

9. The method for optimizing a cost function in logic synthesis according to claim 1, wherein said step of performing timing analysis further includes propagating earliest late arrival times through multiple equivalent driving cells in the DAG.

10. A stored program device readable by a computer, tangibly embodying a program of instructions executable by the computer to perform method steps for optimizing a cost function in logic synthesis, said method steps comprising:

partitioning a circuit into a plurality of slices, each slice representing a subcircuit, each subcircuit having a netlist, a head boundary closer to primary outputs, and a tail boundary closer to primary inputs of the circuit;

matching each net in each subcircuit by advancing from the head boundary of the first subcircuit through each partitioned subcircuit in the direction of primary outputs while generating and implementing cell matches;

covering each net in each subcircuit by advancing from the tail boundary of the first subcircuit through each partitioned subcircuit in the direction of primary outputs while performing timing analysis and selecting matches having optimal times; and discarding portions of subcircuits not selected.

11. A device having computer readable program code embodied thereon for causing the computer to optimize a cost function in logic synthesis, the program code in the device comprising:

partitioning a circuit into a plurality of slices, each slice representing a subcircuit, each subcircuit having a netlist, a head boundary closer to primary outputs, and a tail boundary closer to primary inputs of the circuit;

matching each net in each subcircuit by advancing from the head boundary of the first subcircuit through each partitioned subcircuit in the direction of primary outputs while generating and implementing cell matches;

covering each net in each subcircuit by advancing from the tail boundary of the first subcircuit through each partitioned subcircuit in the direction of primary outputs while performing timing analysis and selecting matches having optimal times; and discarding portions of subcircuits not selected.

* * * * *